United States Patent
Tsai et al.

(10) Patent No.: US 9,446,945 B2
(45) Date of Patent: Sep. 20, 2016

(54) ISOLATION STRUCTURE FOR MEMS 3D IC INTEGRATION

(71) Applicant: Taiwan Semiconductor Manufacturing Co., Ltd., Hsin-chu (TW)

(72) Inventors: Yi-Heng Tsai, Hsinchu (TW); Yi-Hsien Chang, Shetou Township (TW); Chun-Ren Cheng, Hsin-Chu (TW); Chun-Wen Cheng, Zhubei (TW); Tzu-Heng Wu, New Taipei (TW); Wei-Cheng Shen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/639,530

(22) Filed: Mar. 5, 2015

(65) Prior Publication Data

US 2016/0145095 A1 May 26, 2016

Related U.S. Application Data

(60) Provisional application No. 62/082,650, filed on Nov. 21, 2014.

(51) Int. Cl.
| | | |
|---|---|---|
| H01L 31/0203 | (2014.01) | |
| B81B 7/00 | (2006.01) | |
| B81C 1/00 | (2006.01) | |

(52) U.S. Cl.
CPC ........... *B81B 7/0074* (2013.01); *B81C 1/0023* (2013.01); *B81B 2207/03* (2013.01)

(58) Field of Classification Search
CPC .......................... B81B 7/0074; B81C 1/0023
See application file for complete search history.

(56) References Cited

U.S. PATENT DOCUMENTS

2015/0021771 A1*  1/2015  Lin .................... H01L 21/76898
                                                              257/751

* cited by examiner

*Primary Examiner* — Long Pham
(74) *Attorney, Agent, or Firm* — Eschweiler & Associates, LLC

(57) ABSTRACT

A three-dimensional (3D) integrated circuit (IC) includes a first IC and a second IC. The first IC includes a MEMS device and a first bonding structure. The second IC includes a second bonding structure. The first and second bonding structures are bonded together to couple the first IC to the second IC. A conformal barrier layer is disposed over a surface of the second IC nearest the first IC. An etch isolation structure is arranged beneath the surface of the second IC and encloses a sacrificial region which is arranged on either side of the second bonding structure and which is arranged in the second IC.

20 Claims, 6 Drawing Sheets

ISOLATION STRUCTURE FOR MEMS 3D IC INTEGRATION

REFERENCE TO RELATED APPLICATION

This application claims priority to U.S. Provisional Application No. 62/082,650 filed on Nov. 21, 2014.

BACKGROUND

In electronics, a three-dimensional integrated circuit (3D IC) is a chip in which two or more layers of electronic components are integrated both vertically and horizontally into a single circuit. The semiconductor industry is pursuing 3D ICs in many different forms. To help streamline the manufacturing process of 3D ICs, there is an on-going need for improved manufacturing processes and corresponding device structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C each illustrate a cross-sectional view of some embodiments of a 3D IC made up of a MEMS IC and a CMOS IC which are bonded together, and which include an isolation structure to limit over-etching in an upper surface region of the CMOS IC.

FIG. 2 illustrates a top view of the CMOS IC of FIG. 1A with one or more layers omitted for clarity.

DETAILED DESCRIPTION

Figure 3:
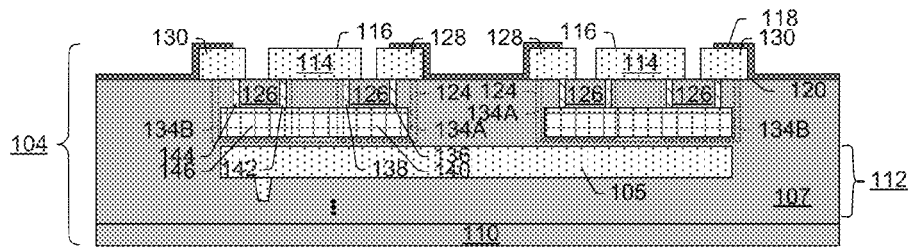
FIGS. 3-6 illustrate cross-sectional views of other embodiments of ICs which include isolation structures to limit over-etching in an upper surface region of the 3D ICs.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some 3D ICs include a complementary metal oxide semiconductor (CMOS) IC bonded to a Micro-Electrical-Mechanical System (MEMS) IC. The CMOS IC includes a plurality of CMOS devices, and the MEMS IC includes at least one MEMS device. The MEMs device is often operably coupled to one or more the CMOS devices through a conductive bonding structure bonding the ICs together. During manufacture, the CMOS IC and MEMS IC are bonded together at a manufacturing stage where sacrificial material on the MEMS IC encases the MEMS device. After the CMOS IC and MEMS IC are bonded together, a release etch, such as a vapor hydrofluoric (vHF) etch, is used to remove the sacrificial MEMS material and thereby release the MEMS device so it can move or flex to achieve its desired functionality. This etch can also come into contact with a surface of the CMOS IC. To protect the CMOS IC from the extremely corrosive nature of this release etch, some CMOS ICs include a thin barrier layer on their outermost surface nearest the MEMS IC. Unfortunately, the force applied in bonding the MEMS IC to the CMOS IC can generate small cracks in this barrier layer. If unaccounted for, these cracks can allow the release etch to propagate into the body of the CMOS IC and cause undesired etching under the barrier layer. This undesired etching can damage the CMOS IC, and ultimately lower the performance for such 3D ICs and/or reduce manufacturing yield for the 3D ICs.

Figures 1A, 1B, 1C, 2:
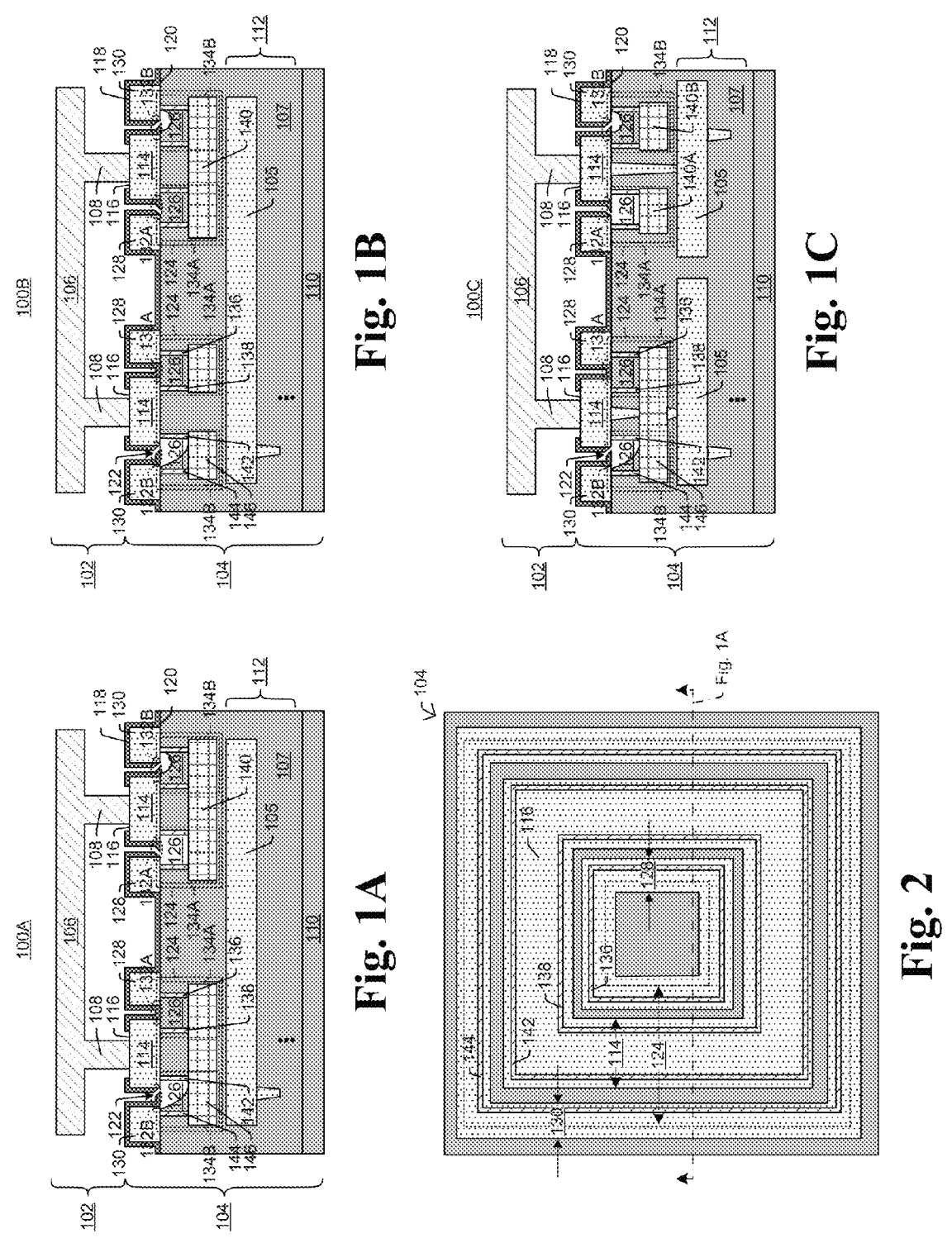

Accordingly, the present disclosure provides for isolation structures and corresponding manufacturing techniques that mitigate over-etching in a controlled and pre-determined manner to limit damage to the CMOS IC in the presence of a MEMS release etch. FIG. 1A shows an example of a 3D IC 100A in accordance with some embodiments. The 3D IC 100A includes a first IC 102, which is now described in the context of a MEMS IC, and a second IC 104, which is now described in the context of a CMOS IC.

The MEMS IC 102 includes a moveable or flexible MEMS device region 106 and a first bonding structure 108, which can manifest as a protrusion that extends outwardly from a surface of the MEMS IC 102. The CMOS IC 104 includes semiconductor substrate 110 on which a plurality of CMOS devices are formed, and an interconnect structure 112 that operably connects the CMOS devices to one another to implement desired IC functionality. FIG. 1A only illustrates an uppermost metallization layer 105 of interconnect structure 112, however any number of such metallization layers can be stacked over one another with dielectric material 107 separating adjacent metallization layers, and with vias coupling adjacent metallization layers.

The CMOS IC 104 also includes a second bonding structure 114, which can manifest as a planar or substantially planar bonding area 116 (e.g., bond pad or solder bump pad) structured to receive the first bonding structure 108 and which is arranged on an upper surface of the CMOS IC 104. The first and second bonding structures 108, 114 are bonded together, for example by a eutectic bond, to couple the MEMS IC 102 to the CMOS IC 104. A conformal barrier layer 118 can cover an upper CMOS IC surface 120 nearest the MEMS IC 102 and can also optionally at least partially cover the second bonding structure 114.

As can be seen in FIG. 2, which shows a top view of FIG. 1A's CMOS IC 104 with barrier layer 118 removed for clarity, in some embodiments the second bonding structure 114 comprises a ring-shaped bonding surface 116. Although not expressly illustrated in FIG. 2, it is to be appreciated that the MEMS IC (e.g., FIG. 1A, 102) will have a corresponding ring-shaped protrusion (e.g., FIG. 1A, 108) that lands on the ring-shaped bonding surface 116.

Referring to FIG. 1A and FIG. 2 concurrently, an inner ring-shaped anchor 128 and an outer ring-shaped anchor 130 are spaced apart from the second bonding structure 114. The inner and outer anchors 128, 130 are concentrically spaced apart from the second bonding structure 114, and hence act to isolate bonding stress on the barrier layer 118. When the MEMS IC 102 is bonded to the CMOS IC 104, the force applied to bond the ICs 102, 104 can form one or more cracks 122 in crack-prone regions 132A, 132B of the barrier layer 118. If present, a crack 122 can extend through the entire thickness of the barrier layer 118 and can be of sufficient width to allow etchants of a MEMS release etch to pass there through. Thus, cracks 122 within the barrier layer 118 will be isolated to an inner crack-prone region 132A and an outer crack-prone region 132B due to the inner and outer anchors 128, 130, respectively. The inner crack-prone region 132A is arranged in barrier layer 118 between the inner anchor 128 and second bonding structure 114. The outer crack-prone region 132B is arranged in barrier layer 118 between the outer anchor 130 and second bonding structure 114.

To limit the extent of over-etching that occurs through crack 122 during MEMS release etching, the CMOS IC 104 includes an etch isolation structure 124. The etch isolation structure 124 is arranged beneath the upper CMOS IC surface 120 and proximate to the crack-prone regions 132. The etch isolation structure 124 encloses a sacrificial region 126 that is adjacent to the crack-prone region 132, and limits the extent of over-etching to the sacrificial region 126.

The etch isolation structure 124 includes an inner etch isolation structure 134A, which straddles neighboring edges of second bonding structure 114 and inner anchor 128. The etch isolation structure 124 also includes an outer etch isolation structure 134B, which straddles neighboring edges of second bonding structure 114 and outer anchor 130. Thus, the inner etch isolation structure 134A includes a first inner isolation sidewall structure 136 extending continuously under the inner ring-shaped anchor 128, a second inner isolation sidewall 138 extending continuously under the ring shaped second bonding structure 114, and a bottom inner isolation structure 140 that extends continuously between the first and second inner isolation sidewall structures 136, 138 to enclose an inner sacrificial region 126. The outer etch isolation structure 134B includes a first outer isolation sidewall structure 142 extending under the second bonding structure 114, a second outer isolation sidewall 144 extending continuously under the outer ring-shaped anchor 130, and a bottom outer isolation structure 146 that extends continuously between the first and second outer isolation sidewall structures 142, 144 to enclose an outer sacrificial region 126.

The release etch used to release the MEMS device 106 from its surrounding sacrificial material may flow through any cracks 122, causing over-etching in sacrificial regions 126 adjacent to cracks 122 in the barrier layer 118. Hence, in FIG. 1A, it can be seen that the sacrificial regions 126 are etched to different extents depending on the size, orientation, and/or location of their corresponding cracks, if any. Thus, air gaps present in the sacrificial regions 126 and formed by the release etch may be in direct contact with the ambient environment through the cracks 122.

The inner and outer anchors 128, 130 can be made of material sufficient to stand up to a MEMS release etch, which is commonly a vHF etch. For example, in some embodiments, the inner and outer anchors 128, 130 can be conductive or non-conductive, and can comprise copper and/or alloys thereof, aluminum and/or alloys thereof, $Al_2O_3$, AlN, a nitride film, tungsten, or other metals, for example. In many embodiments the inner and outer anchors 128, 130 are made of the same material as the second bonding structure 114, which is conductive and can be made of copper and/or alloys thereof, aluminum and/or alloys thereof, or other metals, for example.

The isolation sidewalls 136, 138, 142, 144 can be conductive or non-conductive, and can include copper and/or alloys thereof, aluminum and/or alloys thereof, $Al_2O_3$, AlN, a nitride film, tungsten, or other metals, for example. The bottom isolation structures 140, 146 can be conductive or non-conductive, and can comprise copper and/or alloys thereof, aluminum and/or alloys thereof, $Al_2O_3$, AlN, a nitride film, tungsten, or other metals, for example. The isolation sidewalls 136, 138, 142, 144 are often made of the same material as the bottom isolation structures 140, 146, however the isolation sidewalls and bottom isolation structures can also be different materials in some implementations.

In some embodiments, the barrier layer 118 is made of $Al_2O_3$, AlN, or a nitride film. A dielectric material 107 surrounds the sidewall and isolation structures, and comprise silicon dioxide $SiO_2$ having a dielectric constant of 3.9, or a low-k or extreme low-k dielectric with a dielectric constant less than 3.9. The sacrificial regions 126 also typically comprise this dielectric material.

As shown in FIG. 1B, the inner and outer bottom isolation structures 140, 146 can be spaced apart from one another, by dielectric material 107 for example, rather than being continuous with one another as previously shown in FIG. 1A. In other embodiments (not shown), the inner and outer bottom isolation structures 140, 146 can be arranged in a plate-like arrangement that extends continuously and completely under the upper CMOS IC surface 120, rather than a ring-like structure as illustrated.

Further, as shown in FIG. 1C, in many embodiments the uppermost metallization layer 105 in the interconnect structure 112, which is often a trench or wire made of copper or copper alloy or aluminum or aluminum alloy, can be electrically coupled to the second bonding structure 114 through one or more vias. The left hand portion of FIG. 1C shows an example where the bottom isolation structure 146 is a conductive material, and an upper via extends continuously between the second bonding structure 114 and the bottom isolation structure 146. A lower via then extends between the bottom isolation structure 146 and uppermost metallization layer 105. The right hand portion of FIG. 1C shows a via that extends through an opening in bottom isolation structure 140A/140B from the second bonding structure 114 to uppermost metallization layer 105. Another option (not shown), is to have the bottom isolation structure 140, 146 be a non-conducting material, and for a single via or a stack of vias to extend continuously from the second bonding structure 114 to the uppermost metallization layer 105 while piecing through the non-conductive bottom isolation structure.

FIGS. 3-7 provide some additional embodiments contemplated as falling within the scope of the present disclosure. FIGS. 3-7 each show an example of a CMOS IC which can be bonded to a MEMS IC as previously shown in FIG. 1A. However, for purposes of clarity, the MEMS IC has been omitted from FIGS. 3-7. Further, although FIGS. 3-7 do not shows cracks in barrier layer 118, barrier layer cracks may appear when the CMOS IC 104 is bonded to a MEMS IC 102 and may ultimately lead to partial or complete removal of the sacrificial regions 126 when a release etch is carried out for each of these illustrated structures. Whereas FIG. 1 shows a barrier layer 118 that extended over inner and outer peripheral regions of the second bonding structure 114 and over inner and outer anchors 128, 130, but left a central portion of the second bonding structure 114 uncovered; FIG. 3 shows an embodiment where the barrier layer 118 leaves the entire second bonding structure 114 uncovered and leaves upper surface of sacrificial regions 126 uncovered as well.

Figure 4:
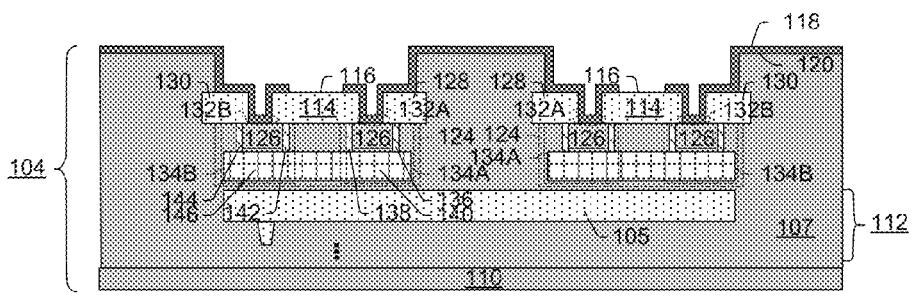

FIG. 4 shows an embodiment where the second bonding structure 114 and inner and outer anchors 128, 130 are recessed beneath the upper CMOS IC surface 120. Thus, in FIG. 4, the barrier layer 118 extends over the upper CMOS IC surface 120, down along sidewalls of the CMOS IC surface before covering the inner and outer anchors 128, 130, and extending over the sacrificial regions 126.

Figure 5:
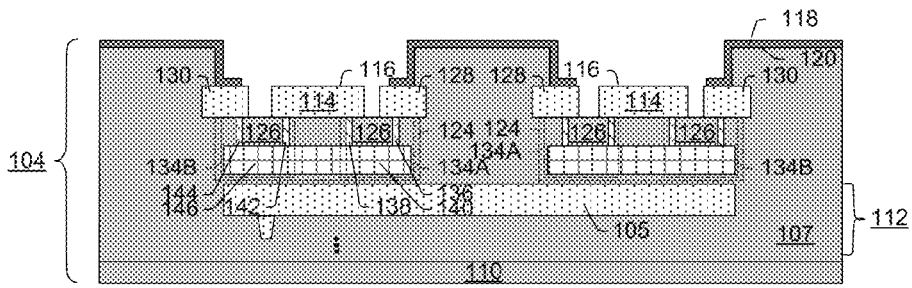

FIG. 5 shows another embodiment where the second bonding structure 114 and inner and outer anchors 128, 130 are recessed beneath the upper CMOS IC surface 120. In FIG. 5, the barrier layer 118 leaves the entire second bonding structure 114 uncovered and leaves upper surface of sacrificial regions 126 uncovered as well.

Figure 6:
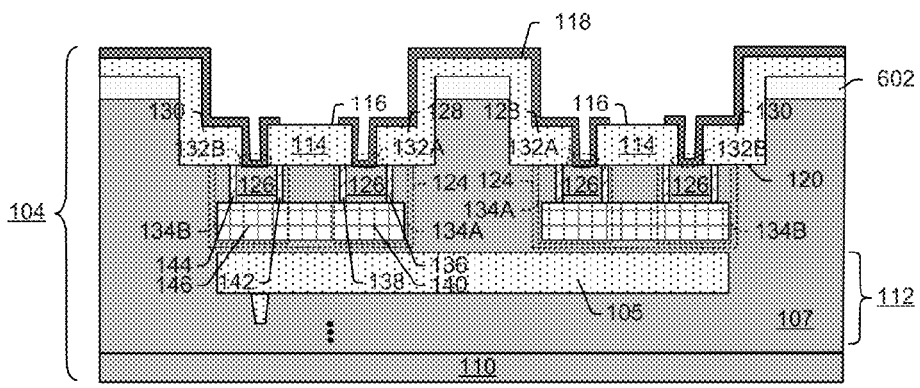

FIG. 6 shows still another embodiment where the second bonding structure 114 and inner and outer anchors 128, 130 are recessed beneath the upper CMOS IC surface 120. In this embodiment, a passivation layer 602, such as a nitride (e.g., SiN), is arranged proximate to the upper CMOS IC surface 120. The inner and outer anchors 128, 130 can then extend upward along sidewalls of the passivation layer 602 and over an upper surface of the passivation layer 602. Other variations are also possible.

Figure 7:
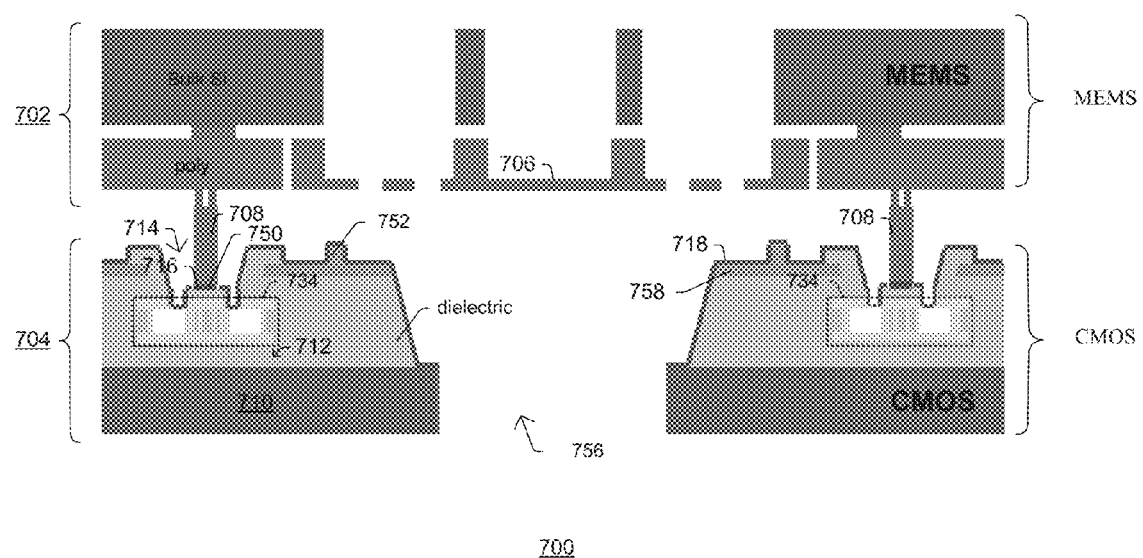
FIG. 7 illustrates a cross-sectional view of other embodiments of a 3D IC made up of a MEMS IC and a CMOS IC which are bonded together, and which includes an isolation structure to limit over-etching in an upper surface region of the CMOS IC.

FIG. 7 shows another embodiment of a 3D IC 700 that includes a CMOS IC 704 and a MEMS IC 702. The MEMS IC 702 includes a moveable or flexible membrane 706, which can be made of polysilicon in some embodiments. A first bonding structure 708 protrudes outwardly from a surface of the MEMS IC 702. The CMOS IC 704 includes semiconductor substrate 710 on which a plurality of CMOS devices are formed, and an interconnect structure 712 that operably connects the CMOS devices to one another to implement desired IC functionality. The CMOS IC 704 includes a second bonding structure 714, which can manifest as a planar or substantially planar bonding area 716 structured to receive the first bonding structure 708. The first and second bonding structures 708, 714 are bonded together, for example by a eutectic bond, to couple the MEMS IC 702 to the CMOS IC 704. A pad 750, such as germanium, gold, or another conductive metal, can be arranged on end of first bonding structure 708 to promote eutectic bonding. A conformal bather layer 718 can cover an upper CMOS IC surface nearest the MEMS IC 702 and can also optionally at least partially cover the second bonding structure 714. Bumps 752 may be present on the CMOS IC surface nearest to the MEMS IC. The function of bumps 752 is to prevent membrane stiction when the conductive membrane 706 is vibrated with large deformation. A conformal release etch barrier layer 718, such as a vHF barrier layer, is formed over the CMOS IC surface. An aperture 756 in the CMOS IC is aligned to the conductive membrane 706. A passivation layer 758, such as SiN, can also be present. Etch isolation structure 734 helps to limit overetching, if any, during a release etch used to release the conductive membrane 706.

In some embodiments, the 3D IC 700 can act as a microphone that converts sound into an electrical signal, although other applications are also possible. During microphone operation, sound in the form of a time-varying pressure wave can pass through aperture 756 and strike the conductive membrane 706, thereby causing small displacements in the conductive membrane 706 relative to an uppermost metallization layer in CMOS IC 704 or some other layer in 3D IC. The magnitude and frequency of these displacements correspond to the volume and pitch of an impingent sound wave. To convert these displacements into an electrical signal, a CMOS circuit on CMOS IC 704 measures the time-varying capacitance between the conductive membrane 706 and the uppermost metallization layer. For example, the CMOS circuit can supply a predetermined charge to the conductive membrane 706 in time, and monitor how a voltage changes between the conductive membrane 706 and uppermost metallization layer as a function of the charge. By taking regular current and voltage measurements, the CMOS circuit can track the capacitance according to the voltage/current relationship:

$$I(t) = C \frac{dV(t)}{dt}$$

where C is the capacitance. Because the time-varying capacitance reflects the time-varying distance between the conductive membrane 706 and uppermost metal layer (and this distance changes in time based on the impingent sound wave), the CMOS circuit can thereby provide an electrical signal representative of sound impingent on the conductive membrane 706.

To provide end customers with a streamlined solution, in some embodiments, the CMOS IC 704 can include circuitry for processing the electrical signal. For example, the CMOS IC 704 can include an analog-to-digital converter (ADC), and/or analog or digital acoustic filters for removing noise from the signals, and/or other signal processing circuitry.

Figure 8:
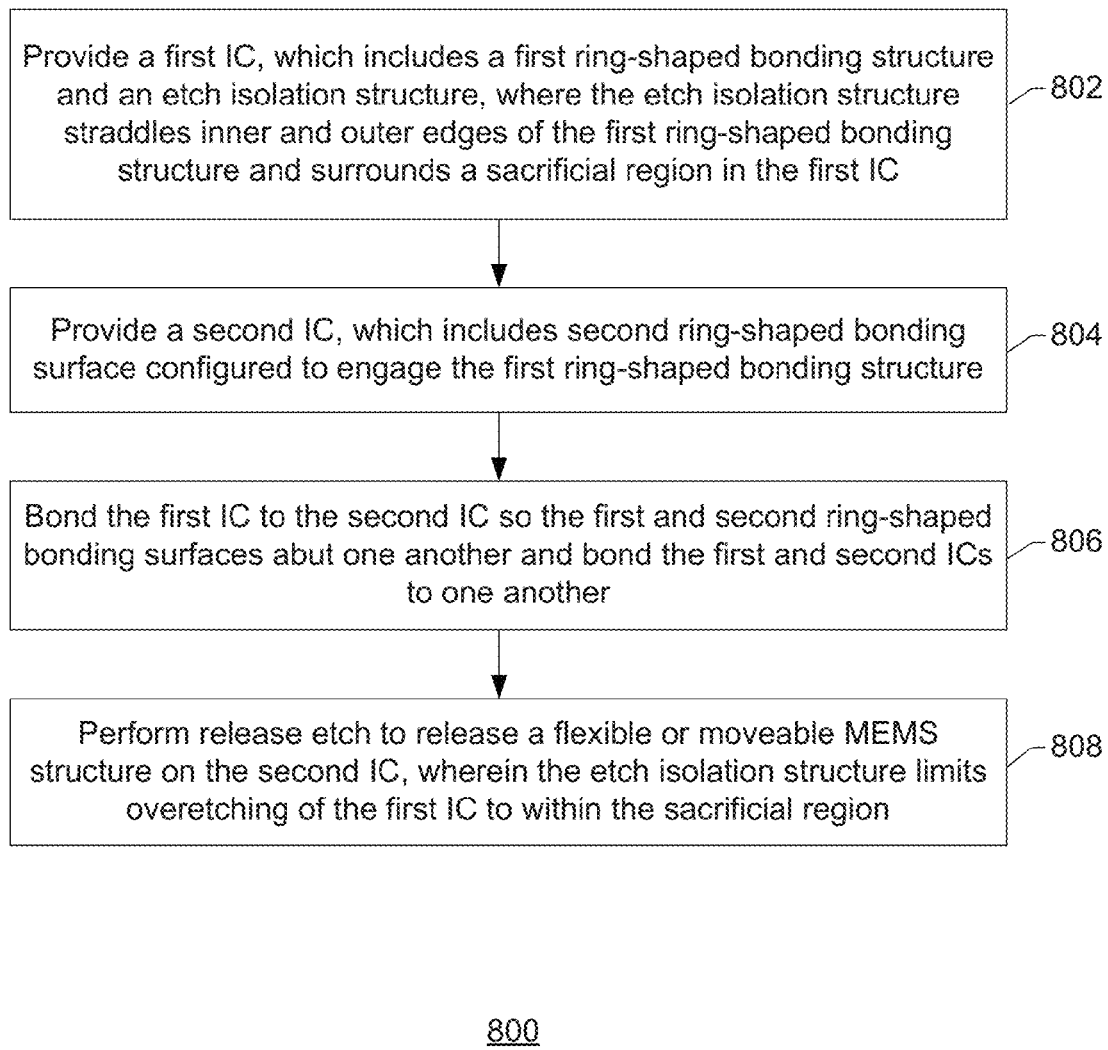
FIG. 8 illustrates a flow chart of a method of manufacturing a 3D IC in accordance with some embodiments.

To illustrate some embodiments of how a 3D IC can be manufactured in accordance with some embodiments, FIG. 8 illustrates a somewhat general manufacturing method in flowchart format while FIGS. 9-11 and FIGS. 12-14 illustrate more detailed manufacturing methods as a series of cross-sectional views. It will be appreciated that although these methods each illustrate a number of acts, not all of these acts are necessarily required, and other un-illustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

Turning now to FIG. 8, method 800 starts at 802 when a first substrate is provided. In 804, a first IC, which includes a first ring-shaped bonding structure and an etch isolation structure, is provided. The etch isolation structure straddles inner and outer edges of the first ring-shaped bonding structure and surrounds a sacrificial region in the first IC. In 804, a second IC, which includes second ring-shaped bonding surface configured to engage the first ring-shaped bonding structure, is provided. In 806, the first IC is bonded to the second IC so the first and second ring-shaped bonding surfaces abut one another and bond the first and second ICs to one another. In 808, a release etch is carried out to release a flexible or moveable MEMS structure on the second IC from surrounding sacrificial material. The etch isolation structure limits over-etching of the first IC to within the sacrificial region.

Figure 9:
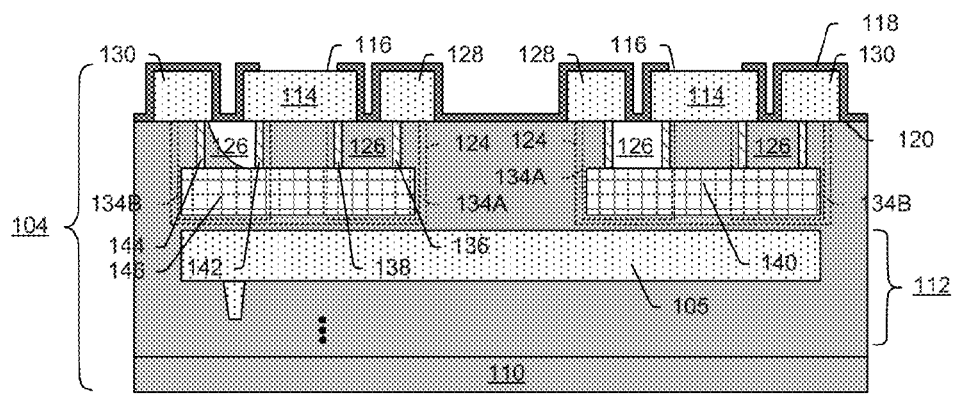
FIGS. 9-11 collectively illustrate a series of cross-sectional views that depict some embodiments of a method for manufacturing a 3D IC which includes an isolation structure to limit over-etching.
Figure 10:
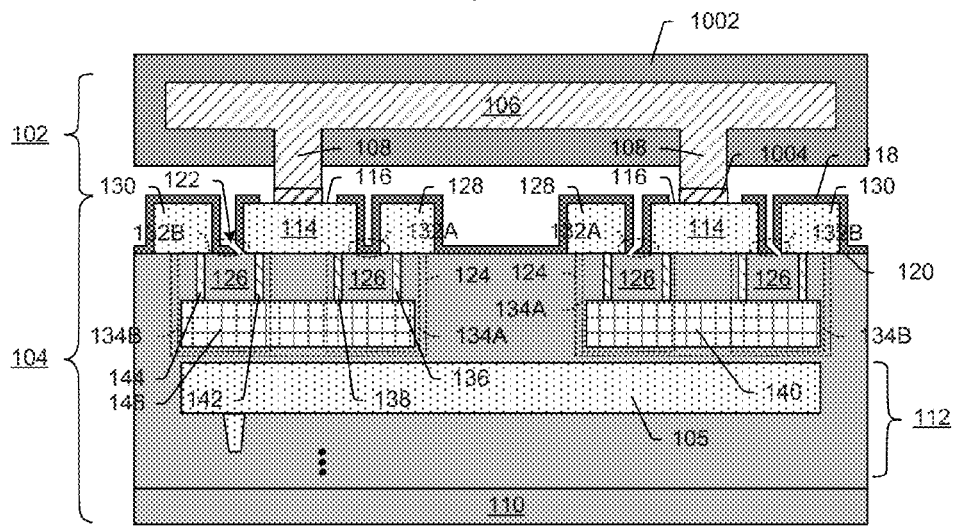
Figure 11:
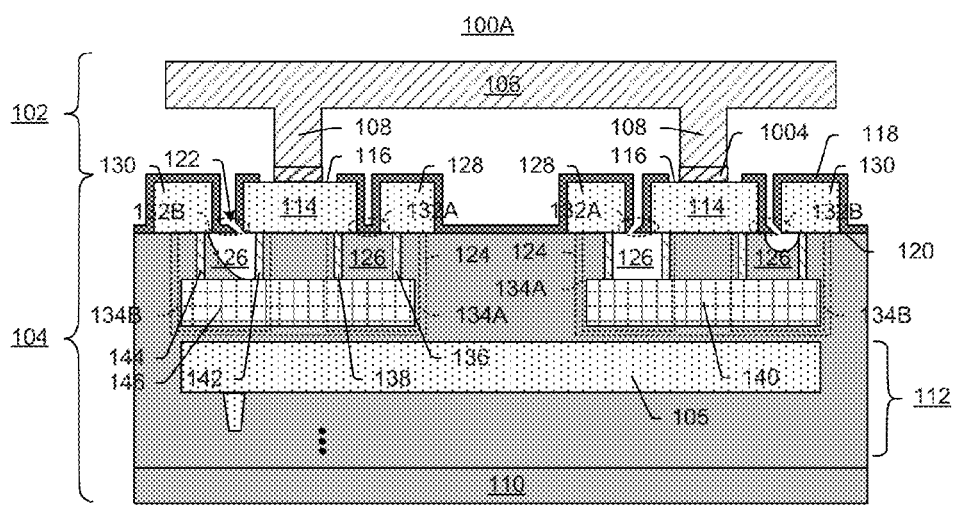

FIGS. 9-11 collectively illustrate a more detailed manufacturing method in accordance with some embodiments. Although FIGS. 9-11 (and 12-14) are described in relation to the method of FIG. 8, it will be appreciated that the structures disclosed in FIGS. 9-14 are not limited to the method, but instead may stand alone as structures independent of the method. Similarly, although the method is described in relation to FIGS. 9-14, it will be appreciated that the method is not limited to the structures disclosed in FIGS. 9-14, but instead may stand alone independent of the structures disclosed in FIGS. 9-14.

More particularly, FIG. 9 illustrates a first die, corresponding to a CMOS IC 104 that includes a number of CMOS transistors, and corresponds to some implementations of act 802 of FIG. 8. For simplicity, device features are not illustrated in FIG. 9, however, the devices (e.g., MOSFETs, FinFETs, BJTs, diodes, or JFETS) can include conductive regions formed in substrate 110 (e.g., n-doped and p-doped regions), as well as alternating conducting and insulating layers under the uppermost metallization layer 105.

Although FIG. 9 only illustrates a single CMOS die, it will be appreciated that in many embodiments, the CMOS die will be included as part of a semiconductor wafer made up of many such die. For example, the wafer can be a bulk or monolithic silicon wafer, or can be a silicon-on-insulator wafer, a binary compound wafer (e.g., GaAs wafer), a ternary compound wafer (e.g., AlGaAs), or higher order compound wafers, with or without additional insulating or conducting layers formed thereover, among others. Additional, in some embodiments, a backside of CMOS IC 104 can be bonded to other dies and/or wafers (not shown).

In FIG. 10, the first die of CMOS IC 104 has been bonded to a second die, corresponding to a MEMS IC 102, and can correspond to some implementations of act 804 and 806 of FIG. 8. The MEMS IC 102 includes a MEMS device 106, which will ultimately move or flex during operation, but which is initially encased in a sacrificial material 1002 when first bonded to the CMOS IC 104. The force applied to bond the MEMS IC 102 to the CMOS IC can cause cracks in the bather layer 118 on upper surface 120 of CMOS IC 104.

The bonding of FIG. 10 can occur when a conductive bonding material 1004 on the end of first bonding structure 108 to bond the MEMS IC 102 to the CMOS IC 104. For example, in some embodiments the conductive bonding material 1004 can facilitate formation of a eutectic alloy through sputtering, dual source evaporation, or electroplating. Eutectic alloys also can be formed by diffusion reactions of pure materials and subsequently melting of the eutectic composition. When used, eutectic bonding is able to produce hermetically sealed packages and electrical interconnection within a single process. In addition, eutectic bonding provides conductive conducts at low processing temperatures, induces low stress in final assembly, and provides high strength bonds with good reliability. In other embodiments, the bonding process can be a fusion bonding process.

In FIG. 11, a release etch, such as a vHF etch is carried out to remove the sacrificial material 1002 surrounding the MEMS device 106, which can correspond to some implementations of act 808 of FIG. 8. This vHF etch thereby makes the MEMS device 106 so it is free to move or flex to achieve desired sensing functionality, which can include acceleration sensing, gyroscopic sensing, pressure sensing, or sound characterization, among others. If present, cracks in the vHF barrier layer 118 can lead to the vHF etchants passing from the ambient environment and eroding the sacrificial regions 126. The sidewalls and bottom surfaces of the etch isolation structure 124 constrain the etching to the predetermined sacrificial regions 126.

Figure 12:
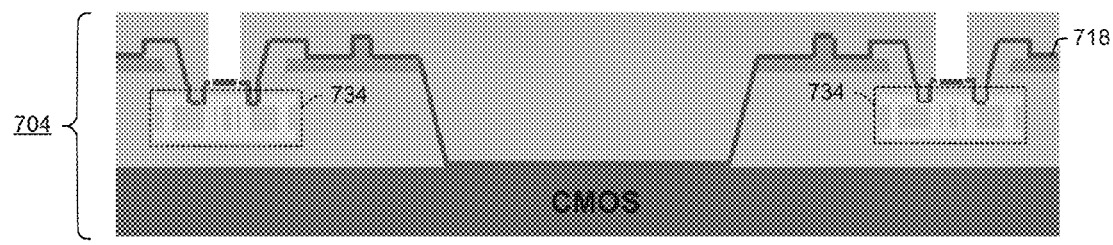
FIGS. 12-14 collectively illustrate a series of cross-sectional views that depict other embodiments of a method for manufacturing a 3D IC which includes an isolation structure to limit over-etching.
Figure 13:
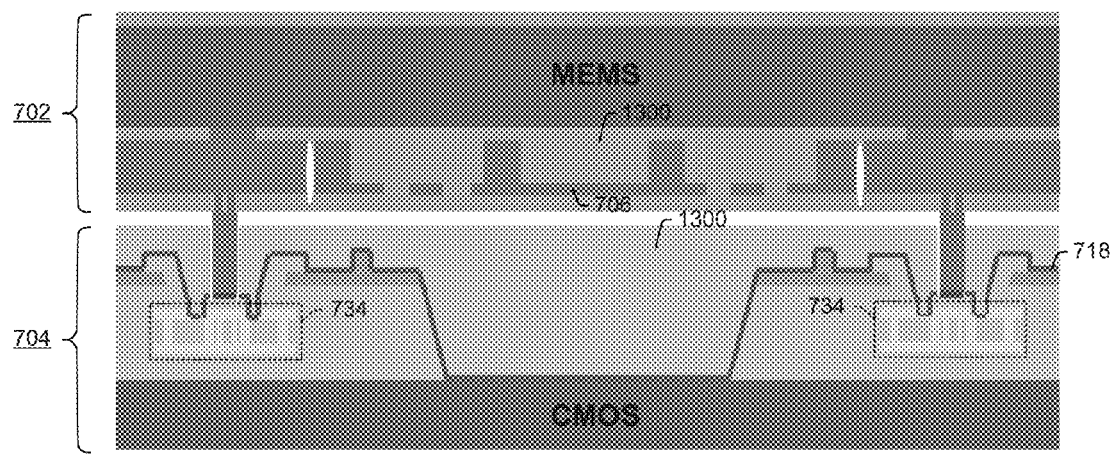
Figure 14:
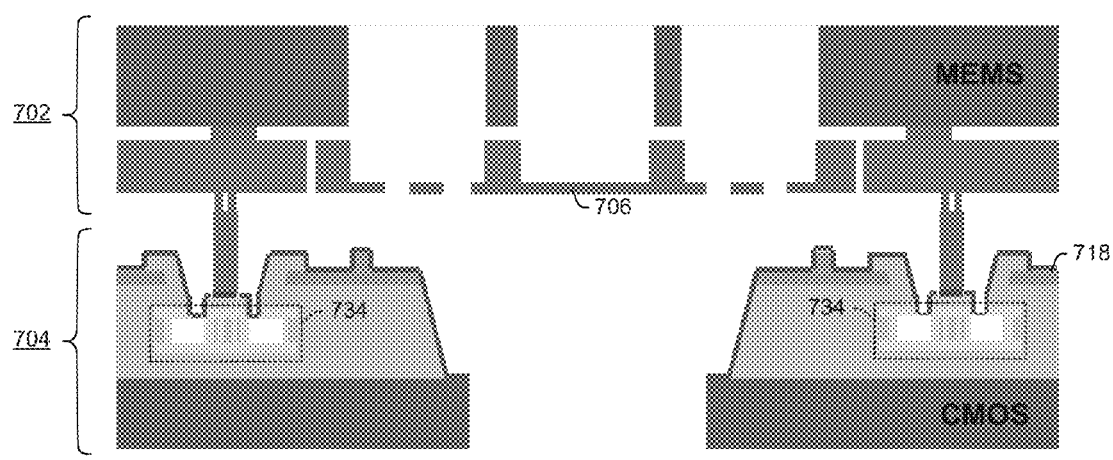

FIGS. 12-14 show another embodiment. In FIG. 12, a CMOS IC 704 which includes isolation structures 734 is formed. In FIG. 13, a MEMS IC 702 in which the conductive membrane 706 is still encased in a sacrificial or protective layer 1300, is bonded to the CMOS IC 704. In FIG. 14, a release etch, such as a vHF etch is carried out to remove the sacrificial material 1300 surrounding the conductive membrane 706. Again, if cracks are present in barrier layer (e.g., due to bonding in FIG. 13), then the etch isolation structures 734 constrain etching to predetermined sacrificial regions.

Thus, it can be appreciated that some embodiments relate to a three-dimensional (3D) integrated circuit (IC) that includes a first IC and a second IC. The first IC includes a MEMS device and a first bonding structure. The second IC includes a second bonding structure. The first and second bonding structures are bonded together to couple the first IC to the second IC. A conformal barrier layer is disposed over a surface of the second IC nearest the first IC. An etch isolation structure is arranged beneath the surface of the second IC and encloses a sacrificial region which is arranged on either side of the second bonding structure and which is arranged in the second IC.

In other embodiments, the present disclosure provides a device, comprising: a first semiconductor substrate; a plurality of complementary metal oxide semiconductor (CMOS) devices arranged on the first semiconductor substrate; an interconnect structure arranged over the plurality of CMOS devices and coupling CMOS devices to one another; a conductive bonding structure arranged over the interconnect structure near an uppermost surface of the integrated circuit; a barrier layer covering the uppermost surface of the IC; and an etch isolation structure proximate to a sidewall of the barrier layer, arranged beneath the uppermost surface of the IC, and enclosing a sacrificial region which is beneath the uppermost surface of the IC and which is proximate to the barrier layer sidewall.

In yet other embodiments, the present disclosure relates to a method. In this method, a first substrate corresponding to a first integrated circuit (IC) is provided, wherein the first IC includes a first ring-shaped bonding structure and an etch isolation structure, wherein the etch isolation structure straddles inner and outer edges of the first ring-shaped bonding structure and surrounds a sacrificial region in the first IC. A second IC is provided, wherein the second IC includes a second ring-shaped bonding surface configured to engage the first ring-shaped bonding structure. The first and second ICs are bonded so the first and second ring-shaped bonding surfaces abut one another. A release etch is carried out to release a flexible or moveable MEMS structure on the second IC from surrounding sacrificial material.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. For example, "a first dielectric layer" described in connection with a first figure may not necessarily corresponding to a "first dielectric layer" described in connection with another figure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC), comprising:
   a first IC including a MEMS device and a first bonding structure;
   a second IC including a second bonding structure thereon, wherein the first and second bonding structures are bonded together to couple the first IC to the second IC;
   a conformal barrier layer over a surface of the second IC nearest the first IC; and
   an etch isolation structure arranged beneath the surface of the second IC and enclosing a sacrificial region in the second IC on either side of the second bonding structure.

2. The IC of claim 1, wherein the conformal barrier layer includes a crack-prone region which includes a crack extending from an outer surface of the conformal barrier layer to the sacrificial region.

3. The IC of claim 2, wherein the crack extends continuously between an ambient environment about the 3D IC and the sacrificial region.

4. The IC of claim 1, wherein the etch isolation structure comprises:
   a first isolation sidewall structure abutting a first outer edge of the sacrificial region, a second isolation sidewall structure abutting a second outer edge of the sacrificial region, and a bottom isolation structure that extends continuously between the first and second isolation sidewall structures and abutting a lower edge of the sacrificial region to enclose the sacrificial region.

5. The IC of claim 1:
   wherein the first bonding structure is a ring-shaped protrusion extending outwardly from the first IC; and
   wherein the second bonding structure comprises a ring-shaped bonding surface configured to receive the ring-shaped protrusion of the first bonding structure.

6. The IC of claim 5, wherein the second IC further comprises:
   an inner ring-shaped anchor that is concentric with regards to the second bonding structure; and
   an outer ring-shaped anchor that is concentric with regards to the second bonding structure and having a larger diameter or width than the inner ring-shaped anchor;
   wherein the ring-shaped protrusion of the first bonding structure abuts the second bonding structure without abutting the inner or outer ring-shaped anchors.

7. The IC of claim 6, wherein the etch isolation structure comprises:
   an inner etch isolation structure including a first inner isolation sidewall structure extending continuously under the inner ring-shaped anchor, a second inner isolation sidewall structure extending continuously under the ring-shaped bonding surface, and a bottom inner isolation structure that extends continuously between the first and second inner isolation sidewall structures to enclose the sacrificial region.

8. The IC of claim 6, wherein the etch isolation structure comprises:
   an outer etch isolation structure including a first outer isolation sidewall structure extending under the ring-shaped bonding surface, a second outer isolation sidewall structure extending continuously under the outer ring-shaped anchor, and a bottom outer isolation structure that extends continuously between the first and second outer isolation sidewall structures to enclose the sacrificial region.

9. A device, comprising:
   a first semiconductor substrate;
   a plurality of semiconductor devices arranged on the first semiconductor substrate;
   an interconnect structure arranged over the plurality of semiconductor devices and coupling semiconductor devices to one another;
   a conductive bonding structure arranged over the interconnect structure near an uppermost surface of the interconnect structure;
   a barrier layer covering the uppermost surface of the device; and
   an etch isolation structure proximate to a sidewall of the barrier layer, arranged beneath the uppermost surface of the device, and enclosing a sacrificial region which is beneath the uppermost surface and which is proximate to the barrier layer sidewall.

10. The device claim 9, further comprising:
    an inner ring-shaped anchor that is concentric with regards to the conductive bonding structure; and
    an outer ring-shaped anchor that is concentric with regards to the conductive bonding structure and having a larger diameter or width than the inner ring-shaped anchor.

11. The device of claim 10, wherein etch isolation structure comprises:
    an inner etch isolation structure including a first inner isolation sidewall structure extending continuously under the inner ring-shaped anchor, a second inner isolation sidewall structure extending continuously under the conductive bonding structure, and a bottom inner isolation structure that extends continuously between the first and second inner isolation sidewall structures to enclose the sacrificial region.

12. The device of claim 9, wherein the barrier layer terminates over a peripheral region of the conductive bonding structure without extending over a central landing region of the conductive bonding structure.

13. The device of claim 12, wherein the barrier layer includes a crack that extends continuously between an outermost surface of the barrier layer and the sacrificial region.

14. The device of claim 13, wherein sacrificial region corresponds to an air gap that is continuous with the crack.

15. The device of claim 9, further comprising: a second substrate, which includes at least one MEMS device, bonded to the conductive bonding structure.

16. A device including a first integrated circuit (IC) bonded to a second IC, comprising:
    a semiconductor substrate corresponding to the second IC;
    an interconnect structure arranged over semiconductor substrate, the interconnect structure including conductive metal features disposed within a dielectric structure;
    a ring-shaped conductive bonding structure arranged over an uppermost surface of the dielectric structure and bonding an upper surface of the first IC to a lower surface of the second IC, the ring-shaped conductive bonding structure covering a first portion of the uppermost surface of the dielectric structure while leaving a second portion of the uppermost surface of the dielectric structure exposed; and
    a first ring-shaped etch isolation structure proximate to one of an inner or outer sidewall of the ring-shaped conductive bonding structure, the first ring-shaped etch isolation structure arranged beneath the uppermost surface of the dielectric structure, and enclosing a sacrificial region of the dielectric structure which is beneath the uppermost surface of the dielectric structure and which is proximate to the one of the inner or outer sidewall.

17. The device of claim 16, further comprising: a vapor hydrofluoric (vHF) etch barrier layer disposed over the uppermost surface of the dielectric structure, wherein the vapor hydrofluoric (vHF) etch barrier layer includes a crack extending from an outer surface of the vHF etch barrier layer to the sacrificial region of the dielectric structure.

18. The device of claim 17, wherein sacrificial region corresponds to an air gap that is continuous with the crack and which is enclosed by the sacrificial region.

19. The device of claim 16, wherein the first ring-shaped etch isolation structure comprises:
    a first isolation sidewall structure abutting a first outer edge of the sacrificial region, a second isolation sidewall structure abutting a second outer edge of the sacrificial region, and a bottom isolation structure that extends continuously between the first and second isolation sidewall structures and abutting a lower edge of the sacrificial region to enclose the sacrificial region of the dielectric structure.

20. The device of claim 16, further comprising:
    a second ring-shaped etch isolation structure proximate to the other of the inner or outer sidewall of the ring-shaped conductive bonding structure and being concentric with the first ring-shaped etch isolation structure.

* * * * *